United States Patent [19]

Sigusch

[11] 4,376,658

[45] Mar. 15, 1983

[54] METHOD OF PRODUCING STRUCTURES COMPOSED OF PHOTOSENSITIVE RESIST FOR INTEGRATED SEMICONDUCTOR CIRCUITS

[75] Inventor: Reiner Sigusch, Munich, Fed. Rep. of Germany

[73] Assignee: Siemens Aktiengesellschaft, Berlin & Munich, Fed. Rep. of Germany

[21] Appl. No.: 250,538

[22] Filed: Apr. 3, 1981

[30] Foreign Application Priority Data

Apr. 25, 1980 [DE] Fed. Rep. of Germany ....... 3016050

[51] Int. Cl.³ .................... G03C 5/00; C03C 15/00; C03C 27/06
[52] U.S. Cl. ................................. 148/1.5; 148/187; 156/643; 427/336; 430/312
[58] Field of Search ................ 148/1.5, 187; 430/312; 427/336; 156/643

[56] References Cited

U.S. PATENT DOCUMENTS

| 3,873,313 | 3/1975 | Horst et al. | 430/312 |
|---|---|---|---|
| 3,955,981 | 5/1976 | Stachniak | 430/312 |
| 3,957,552 | 5/1976 | Ahn et al. | 430/312 |
| 4,088,490 | 5/1978 | Duke et al. | 430/312 |
| 4,201,800 | 5/1980 | Alcorn et al. | 156/643 |
| 4,253,888 | 3/1981 | Kikuchi | 148/187 |

OTHER PUBLICATIONS

Bickford et al., IBM-TDB, 16 (1973) 47.
Kaplan et al., IBM-TDB, 15 (1972) 2239.
S. S. Liu et al, "A High-Performance MOS Technology for 16K Static RAM", *IEDM Digest of Technical Papers*, (Dec. 1979), pp. 352–354.

*Primary Examiner*—Upendra Roy
*Attorney, Agent, or Firm*—Hill, Van Santen, Steadman, Chiara & Simpson

[57] ABSTRACT

Structures composed of photosensitive resist are produced for semiconductor circuits by first generating a mask of a photosensitive resist onto a substrate and then applying a layer of a photosensitive resist over the entire surface of the substrate, including the first generated mask, so that such mask dissociates or dissolves by the material of the subsequently applied layer, which is then structured. In this manner, an improved adhesion of the resist structures to the substrate is achieved and simultaneously cleansing steps are eliminated. The inventive process is utilized for all processes during manufacture of semiconductor circuits wherein at least two photolithographic processes occur without the intervention of a high temperature step.

10 Claims, 4 Drawing Figures

METHOD OF PRODUCING STRUCTURES COMPOSED OF PHOTOSENSITIVE RESIST FOR INTEGRATED SEMICONDUCTOR CIRCUITS

BACKGROUND OF THE INVENTION

1. Field of the Invention

The invention relates to a method of producing structures for integrated semiconductor circuits and somewhat more particularly to a method of producing structures composed of photosensitive resists on substrates for semiconductor circuits, during the manufacture of which photolithographic processes are successively executed for producing masking structures without the intervention of a high temperature process.

2. Prior Art

Photolithographic steps are contained in the process sequence for manufacture of integrated circuits on silicon crystal wafers. During such manufacture, a photosensitive resist structure functions for masking and/or structuring the semiconductor surface. For example, a layer of a photosensitive resist which functions positively, can be applied to a silicon crystal wafer, coated over its entire surface with a silicon dioxide layer, and such resist layer can then be exposed and developed to form select structures, generally termed masks. A photosensitive resist mask generated in such a manner can either be employed in subsequent etching processes for structuring the silicon dioxide layer located therebelow or such mask can be used directly as a mask for doping substances to be implanted into the silicon crystal wafer.

In instances where two such photolithographic steps directly follow one another in a process sequence, then the adhesion of the second layer of photosensitive resist to the substrate surface (in the above discussion, to the oxide layer) can become so unsatisfactory, if no high temperature process intervenes, that the generated structure of photosensitive resist shifts or even comes-off during the development process or during rinsing after development.

In order to prevent such loosening or lifting-off of resist structures, the art presently completely removes the first generated resist mask, cleans the silicon wafer and thereafter tempers the wafer, for example, for one hour at, for example, 300° C. in a nitrogen atmosphere and only then applies the second layer of photosensitive resist, after the application of an adhesion promoter. This second layer is then structured into a desired mask. Thus, a satisfactory adhesion of a second or subsequent photosensitive resist layer on a silicon crystal wafer provided with, for example, a silicon dioxide layer, is presently achievable by a thorough cleansing of the substrate surface, tempering and the application of an adhesion promoter.

SUMMARY OF THE INVENTION

The invention provides a process whereby a satisfactory adhesion of a second or subsequent photosensitive resist layer to a substrate for a semiconductor circuit, for example, a silicon wafer having an oxide layer thereon, is achieved and the prior art cleaning and tempering steps are eliminated.

In accordance with the principles of the invention, during the manufacture of integrated semiconductor circuits wherein photolithographic processes successively occur for production of resist structures functioning as masks, without the intervention of a high temperature process, the first generated resist mask structure is at least partially dissolved or dissociated in a second applied photosensitive resist layer or such first generated mask structure can be at least partially removed by a solvent contained in the photoresist layer and thereafter the second layer of photosensitive resist can be applied over the remaining surface of the substrate, adjusted to a desired thickness and then structured to form a second mask.

In certain embodiments of the invention, photosensitive resists containing similar or identical solvent component are utilized for the successive photolithographic processes. In the embodiment wherein the first generated resist mask structure is at least partially removed by a solvent contained in the photosensitive resist, an adhesion promoter (for example, hexamethyldisilazane) can be added or the photosensitive resist can itself contain an adhesion promoter.

In certain embodiments of the invention, in order to further promote adhesion and in order to evaporate the solvent contained in a photosensitive resist, a tempering step at temperatures in the range of about 50° through 120° C. can be carried out before the exposure and development (i.e., structuring) of the second layer of photosensitive resist, which is preferably adjusted to a thickness of about 0.5 through 2.5 $\mu$m and after structuring (exposure, development and rinsing), a subsequent or second tempering step can take place at a temperature in the range of about 50° through 150° C.

In comparison to the known method, the process occurring in accordance with the principles of the invention is advantageous in that fewer process steps are required for generating these structures because of the dissociation or solution of the first photosensitive resist mask in the second layer of photosensitive resist and in that a contamination of the substrate surface which might occur during additional processing steps, is excluded so that a higher yield of functional circuits can be obtained.

The inventive method, which can be repeated as desired, can be utilized in all processes of semiconductor technology wherein photolithographic methods for generating photosensitive resist maskings must be carried out directly after one another in order, for example, to successively dope different channel areas of a substrate by ion implantation. Such a process is described, for example, in IEDM Digest of Technical Papers, December 1979, pages 352–354. The inventive method is also advantageously utilized for the application of metallizations to substrates according to the lift-off technique whereby a mask for contact holes in a layer of photosensitive resist, which serves for structuring the lift-off mask, is dissolved or dissociated.

DESCRIPTION OF PREFERED EMBODIMENTS

Figure 1:
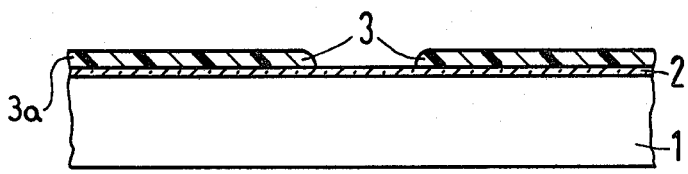
FIGS. 1 through 4 are partial, elevated, schematic views of an integrated semiconductor circuit being sequentially processed in accordance with the principles of the invention.

In the drawings, like elements throughout the various figures are designated with like numerals.

In order to further illustrate to those skilled in the art further details of the invention, an exemplary embodiment thereof is set forth below. However, this embodiment is not to be construed as limiting the scope of the invention in any manner.

Figure 2:
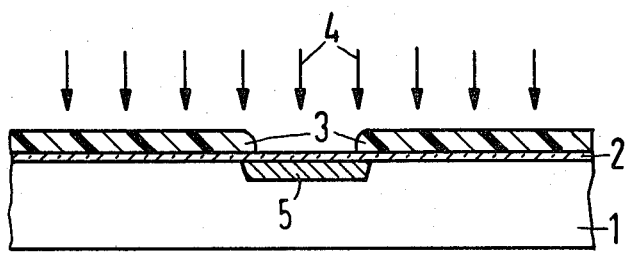
Figure 3:
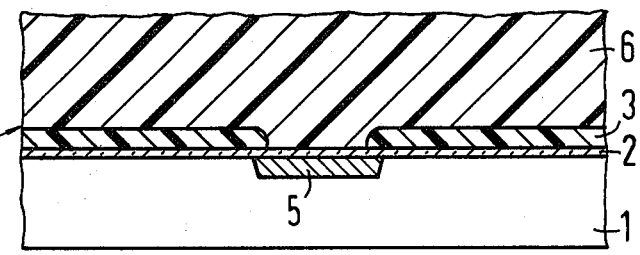

A 1.0 μm thick layer 3a composed of a photosensitive resist, for example, a positive-type photosensitive resist as is commerically available from Shipley under the trade designation AZ 1350 H, is applied to a silicon crystal substrate 1 coated surface-wide with a 50 nm thick silicon dioxide layer 2 and structured by exposure and development to provide a mask structure 3 as illustrated at FIG. 1. The so-generated resist mask structure 3 located on the substrate 1, 2, as illustrated in FIG. 2, is, in this exemplary embodiment, then utilized as an implantation mask for a boron implantation (schematically indicated by arrows 5). Such implantation generates a p-doped zone or channel 5 in the silicon crystal substrate 1. Arsenic can also be implanted, instead of boron.

After termination of the implantation, the arrangement 1, 2, 5 having a mask structure 3 composed of a photosensitive resist (a first generated mask structure) is then covered over its entire surface, including mask structure 3, with a layer 6 composed of a positively functioning photosensitive resist. The first generated mask structure 3 completely dissolves or dissociates in the resist layer 6, although it may only partially dissolve or dissociate in such layer.

The photosensitive resists used to generate mask 3 and layer 6 may be chemically similar and may contain, prior to structuring, similar or identical solvent components. In certain embodiments (not illustrated) a solvent for the photosensitive resist may first be applied onto the mask structure 3 so as to totally or partially remove it and thereafter the layer 6 can be applied as described earlier. Of course, and more preferably, the solvent is contained in the applied photosensitive resist so that only a single application step is required. Further, if desired, an adhesive promoter, such as hexamethyldisilazane, can be admixed into the solvent-resist system and this overall mixture utilized to coat the first generated mask structure 3 so as to at least partially dissociate such structure and promote adhesion of the second applied layer to the underlying surface.

After the mask structure 3 is at least partially dissolved or dissociated in the layer 6, the thickness of the resultant layer 63a is adjusted to a desired value, for example 1 μm, by spinning-off excess resistant material from this layer.

Figure 4:
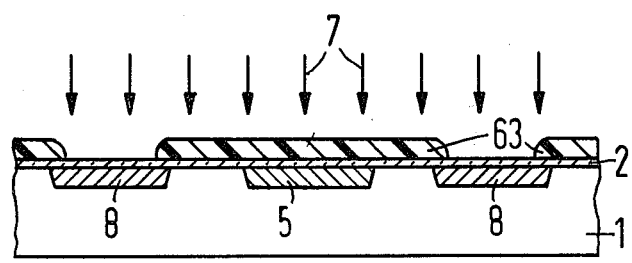

After conventional exposure and development of layer 63a, a mask structure 63 is attained, as illustrated at FIG. 4. Mask structure 63 is then utilized as an implantation mask for a subsequent arsenic implantation (schematically illustrated by arrows 7). Such implantation produces n-doped zones or channels 8 in the silicon substrate 1. Boron can also be implanted, instead of arsenic.

Of course, the above described sequence of generating a mask, undertaking channel implantations with select dopant substances, removing or dissociating such first mask and generating a second mask and thereafter conducting a further channel implantation can be repeated as often as desired. Similarly, this process can be utilized for application of metallizations to substrates according to the lift-off technique whereby a mask for contact holes in a layer of photosensitive resist, which serves for structuring the lift-off mask, is dissolved or dissociated by the second applied photosensitive resist layer.

As is apparent from the foregoing specification, the present invention is susceptible of being embodied with various alterations and modifications which may differ particularly from those that have been described in the preceding specification and description. For this reason, it is to be fully understood that all of the foregoing is intended to be merely illustrative and is not to be construed or interpreted as being restrictive or otherwise limiting of the present invention, excepting as it is set forth and defined in the hereto-appended claims.

I claim:

1. In a method of producing structures composed of photosensitive resist layers on substrates provided for integrated semiconductor circuits wherein during the manufacture of such circuits, the production of structures functioning as masks occurs successively without the intervention of a high temperature process, the improvement consisting of the sequential steps of:
    applying a photosensitive resist onto a substrate, generating a desired first mask structure therefrom and utilizing said mask to apply a select material onto said substrate;
    applying a layer of a photosensitive resist onto the entire surface area of said substrate, including said mask structure;
    said photosensitive resist utilized to generate said first mask structure and said photosensitive resist applied as a layer thereon containing similar solvent components so that at least a portion of said first mask structure disassociates into said layer or is removed by said solvent component; and
    adjusting the thickness of said layer to a desired value, structuring said layer into a desired second mask structure and utilizing said second mask to apply a select material onto said substrate.

2. In a method as defined in claim 1 wherein said solvent for the photosensitive resists is applied first and removes at least a portion of said first generated mask structure and thereafter said layer of photosensitive resist is applied onto the remaining surface of the substrate.

3. In a method as defined in claim 1 wherein said solvent for the photosensitive resists and said layer of photosensitive resist are applied simultaneously and at least partially dissolve said first generated mask structure.

4. In a method as defined in claim 1 wherein said photosensitive resists contain the same solvent components.

5. In a method as defined in claim 1 wherein an adhesion promoter is added at least to the solvent applied onto said first generated mask structure for the dissociation of said mask structure.

6. In a method as defined in claim 1 wherein a first tempering step at temperatures in the range of about 50° through 120° C. is carried out before structuring of said layer of photosensitive resist applied onto the first generated mask structure and a second tempering step at a temperature in the range of about 50° C. through 150° C. is carried out after structuring said layer.

7. In a method as defined in claim 1 wherein said layer of photosensitive resist applied onto the first generated mask structure is adjusted to a thickness in the range of about 0.5 to 2.5 μm.

8. In a method as defined in claim 1 wherein at least two channel implantations with select dopant substances in different areas of the substrate occur substantially immediately after one another and respectively occur after the generation of said mask structure and after the structuring of said photosensitive resist layer.

9. In a method as defined in claim 1 wherein a metallization is applied in accordance with a lift-off technique.

10. In a method as defined in claim 8 wherein each of said channel implantations occurs with different dopant substances.

* * * * *